(12) United States Patent
Bhattacharjee et al.

(10) Patent No.: US 7,265,623 B2
(45) Date of Patent: Sep. 4, 2007

(54) DIFFERENTIAL AMPLIFIER HAVING INDEPENDENTLY TUNABLE BASE GAIN, PEAK GAIN AND BOOST FREQUENCY, AND USES OF SAME

(75) Inventors: Jishnu Bhattacharjee, San Jose, CA (US); Debanjan Mukherjee, San Jose, CA (US)

(73) Assignee: Scintera Networks, Inc., Sunnyvale, CA (US)

( * ) Notice: Subject to any disclaimer, the term of this patent is extended or adjusted under 35 U.S.C. 154(b) by 55 days.

(21) Appl. No.: 10/911,447

(22) Filed: Aug. 3, 2004

(65) Prior Publication Data
US 2006/0028275 A1 Feb. 9, 2006

(51) Int. Cl.
*H03F 3/45* (2006.01)
(52) U.S. Cl. ..................................... 330/254
(58) Field of Classification Search .............. 330/305, 330/254, 134
See application file for complete search history.

(56) References Cited

U.S. PATENT DOCUMENTS

| | | | |
|---|---|---|---|
| 5,389,893 A * | 2/1995 | Itri et al. ................ | 330/254 |
| 5,633,765 A | 5/1997 | Lin et al. ................ | 360/46 |
| 6,023,192 A | 2/2000 | Didier | |
| 6,545,502 B1 | 4/2003 | Dasgupta et al. ........ | 326/21 |
| 6,583,667 B1 | 6/2003 | Dasgupta et al. ........ | 330/254 |
| 6,717,467 B2 | 4/2004 | Renous et al. ........... | 330/253 |
| 6,771,124 B1 * | 8/2004 | Ezell ...................... | 330/129 |
| 6,825,722 B2 * | 11/2004 | Segawa .................. | 330/254 |
| 6,985,036 B2 * | 1/2006 | Bhattacharjee et al. ... | 330/254 |
| 7,049,888 B2 * | 5/2006 | Soda ...................... | 330/253 |
| 2004/0189387 A1 * | 9/2004 | Okamoto ................ | 330/253 |
| 2006/0091954 A1 | 5/2006 | Darabi | |

* cited by examiner

*Primary Examiner*—Robert Pascal
*Assistant Examiner*—Alan Wong
(74) *Attorney, Agent, or Firm*—MacPherson Kwok Chen & Heid LLP; Gideon Gimlan

(57) ABSTRACT

A waveform shaping method comprises: (a) receiving link-distorted signal pulses; (b) passing the link-distorted signal pulses through a series of differential amplifiers each have independently tunable, base gains, peak boost gains, boost frequencies and boost bandwidths; and (c) adjusting one or more of the base gains, peak boost gains, boost frequencies and boost bandwidths of the series of differential amplifiers so as to realize a selective and progressive waveform re-shaping of the link-distorted signal pulses. In one embodiment, each amplifier in the series has first and second transistors with respective first and second drain nodes through which sum-constant currents respectively flow; and first and second, variable drain impedances (Zd1, Zd2) coupled to the first and second drain nodes, where each of the variable drain impedances has a non-negligible inductance (L), a non-negligible capacitance (C) and a non-negligible resistance (R), and where at least two of the R, L and C factors are programmably and independently adjustable so that an input voltage versus output voltage transfer function of the differential amplifier can exhibit a peak gain at a corresponding peak boost frequency which is greater than a base gain of the differential amplifier at 0 Hz.

28 Claims, 8 Drawing Sheets

400

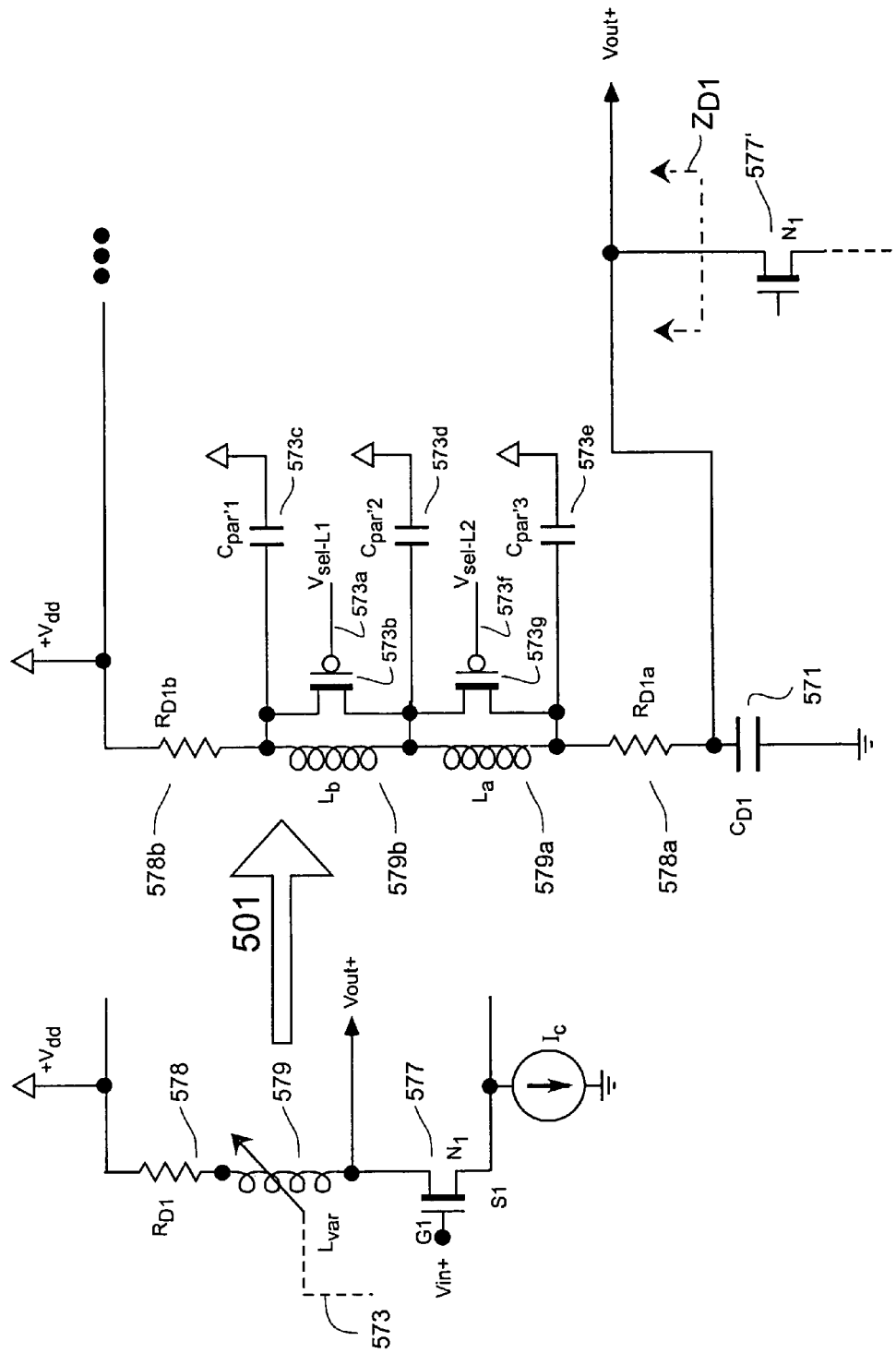

500'''

500''''

DIFFERENTIAL AMPLIFIER HAVING INDEPENDENTLY TUNABLE BASE GAIN, PEAK GAIN AND BOOST FREQUENCY, AND USES OF SAME

FIELD OF DISCLOSURE

The invention relates generally to tunable amplifiers and more specifically to differential amplifiers having variable gain in both the time and frequency domains.

CROSS-REFERENCE TO CO-OWNED APPLICATIONS

The following copending U.S. patent applications are owned by the owner of the present application, and their disclosures are incorporated herein by reference:

(A) Ser. No. 10/698,317 filed: Oct. 30, 2003 by Mukherjee et al and originally entitled "Programmable Passive Inductor";

(B) Ser. No. 10/724,444 filed: Nov. 26, 2003 by Bhattacharjee et al and originally entitled "Method and Apparatus for Automatic Gain Control"; and (C) Ser. No. 10/724,449 filed: Nov. 26, 2003 by Bhattacharjee et al and originally entitled "Digitally Controlled Transconductance Cell".

CROSS REFERENCE TO PATENTS

The disclosures of the following U.S. patents are incorporated herein by reference:

(A) U.S. Pat. No. 6,545,502 issued Apr. 8, 2003 to Dasgupta et al. and entitled "High frequency MOS fixed and variable gain amplifiers"; and (B) U.S. Pat. No. 6,717,467 issued Apr. 6, 2004 to Renous et al. and entitled "Wideband differential amplifier comprising a high frequency gain-drop compensator device".

DESCRIPTION OF RELATED ART

High speed communication links such as optical fiber links or electrically conductive links (e.g., copper links) can operate at very high serial data rates, 1 Gb/s (one Giga bits per second) to 10 Gb/s for example. When a series of essentially rectangular pulses are applied to one end of a relatively long link (e.g., a fiber link of about 10 km in continuous length or greater for the 1 Gb/s rate or about 100 meters or greater for the 10 Gb/s rate, where these distance numbers may vary depending on types and quality of optical fibers, optical sources and detectors used), the output signals at the other end often emerge distorted. Observed distortions may include those due to dispersion effects such as loss of rectangular pulse waveshape, overlap of adjacent pulses and/or loss of pulse magnitude. It is often desirable reconstruct the original input signal from the distorted output signals to reasonable extent so that the reconstructed signal can be retransmitted into a next successive, high speed communication link and/or so it can be correctly processed by a local digital receiver.

One of the problems encountered in trying to reconstruct an original signal from a link-transmitted signal is that of the link's signal propagation characteristics changing over time and the amount and/or kind of distortion changing with those changing propagation characteristics. Link propagation characteristics can change in response to unpredictable factors such as changes in ambient temperature, changes in ambient pressure, introduction of physical twists or kinks into the physical routing of the transmission fiber or cable, and application of vibrational stresses or strains on the link medium. Signal reconstruction methods should be able to cope with these real time changes to the signal propagation characteristics of the link as well as coping with the use of different lengths of continuous link medium (e.g., fiber) and with the use of different transmission rates. A distortion removal system is needed that can cope with static and dynamic variations to the signal propagation characteristics of a link.

SUMMARY

Structures and methods may be provided in accordance with the present invention for overcoming the above-described problems.

A differential amplifier in accordance with the invention comprises: (a) first and second symmetrical transistors having respective first and second drain nodes through which sum-constant currents ($I_{d1}+I_{d2}=I_c$) respectively flow; and (b) first and second, variable and symmetrical drain impedances ($Z_{d1}$, $Z_{d2}$) respectively coupled to the first and second drain nodes, where each of the variable drain impedances has a non-negligible inductance (L), a non-negligible capacitance (C) and a non-negligible resistance (R), and where one, or at least two of said R, L and C are programmably adjustable so that an input voltage versus output voltage transfer function of the differential amplifier can be programmably tuned in real time to exhibit a desired amount of peak gain at a corresponding, and programmably-determinable peak boost frequency, where the peak gain is greater than a base gain of the differential amplifier at 0 Hz. In one embodiment, the base gain is also programmably adjustable. The boost bandwidth is programmably adjustable. Accordingly, each of the following amplifier characteristics is independently tunable: boost frequency, amount of boost, boost bandwidth, and base gain.

A cascaded series of differential amplifiers may be provided in accordance with the invention where each of the cascaded amplifiers has an independently and programmably tunable boost frequency, a programmably adjustable boost bandwidth, and an independently and programmably adjustable amount of boost at the boost frequency. The cascaded series of such differential amplifiers allows for selective and progressive waveshaping of received signal pulses with real-time, adaptive alteration to the waveshaping process.

An adaptive waveform reshaping unit in accordance with the invention includes a series of differential amplifiers each have independently tunable, base gains, boost frequencies, boost bandwidths and boost amounts, thereby allowing for selective and progressive waveshaping of received signal pulses where the waveshaping process can be adaptively altered in real time response to changed conditions, such as changes in the signal propagation characteristics of an associated communications link.

A waveform shaping method in accordance with the present invention comprises: (a) receiving link-distorted signal pulses; (b) passing the link-distorted signal pulses through a series of differential amplifiers each have independently tunable, base gains, boost frequencies, amounts of boost at the boost frequencies, and boost bandwidths; and (c) adjusting one or more of the base gains, amounts of boost, boost frequencies and boost bandwidths of the series of differential amplifiers so as to realize a selective and progressive waveform re-shaping of the link-distorted signal pulses.

Other aspects of the disclosure will become apparent from the below detailed description.

BRIEF DESCRIPTION OF THE DRAWINGS

The below detailed description section makes reference to the accompanying drawings, in which:

FIG. 5A is a schematic diagram showing a first method for implementing discretely variable inductance ($L_{var}$) for the variable-RLC differential amplifiers of the invention;

DETAILED DESCRIPTION

Figure 1:
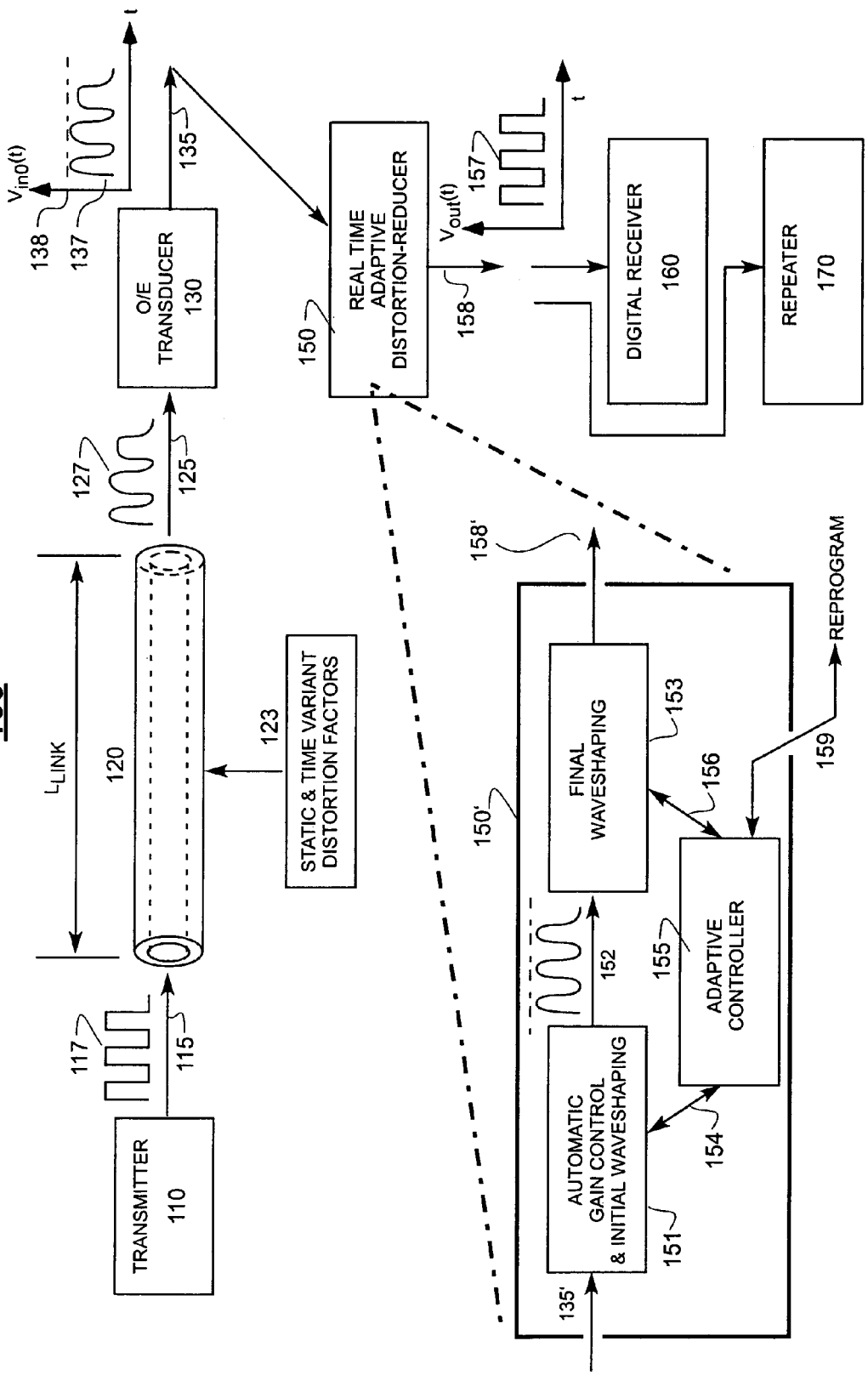
FIG. 1 is a schematic diagram showing a high speed transmission environment in which the receiving end includes an adaptive, real-time distortion remover.

Referring to FIG. 1, an environment 100 in which differential amplifiers of the present invention may be employed is first described. Transmitter 110 supplies a series of substantially rectangular signal pulses 117 along optical coupling 115 into a continuous fiber optic link 120. It is to be understood that the illustrated pulses at 117 are merely representative of the rectangular shape of each individual pulse and that, in practice, the pulses can be of differing pulse durations (e.g., pulse width modulation) and/or differing spacings and/or operating in different optical frequency domains and that various clock recovery techniques may be employed such as run length limited coding (RLL).

Depending on the transmission rates of the pulsed signals 117 and on the transmission mode (single or multi-mode), and on the materials used in the transmission media, the maximum allowed, continuous physical length, $L_{LINK}$, of the fiber 120 may vary in the range of about 100–400 meters to about 30–150 kilometers, where the smaller maximum lengths are associated with signals transmitted in the higher frequency range (e.g. about 10 Gb/s) and the longer, allowed fiber lengths are associated with signals transmitted in the lower frequency range (e.g. about 1 Gb/s). The maximum length limitations are imposed because of the pulse-distorting characteristics of the fiber link 120. As the signal 117 progressively travels further along the length of the fiber material, the signal becomes progressively more and more distorted due to inherent distorting characteristics of successive parts of the link. At some point, the signal 127 emerging from the other end of the link will be too distorted to allow for protocol-free reconstruction of the original signal 117. Hence, a maximum allowed length is specified. In any given application, the actual length, $L_{LINK}$, and the fiber material may be different and the amount of distortion may accordingly also be different. Distortion removal should account for the differing actual lengths, $L_{LINK}$, and differing media materials of different links. Aside from these static factors, the signal distorting characteristics of the link 120 may be subject to a variety of time variant distortion-affecting factors 123 such as variable physical routing of the fiber or cable around twists and through turns where such physical routing can change over time, introduction of kinks into fiber or cable, changes in ambient temperature, changes in ambient pressure, and application of vibrational stresses or strains to the fiber over real time.

As seen at 127, the waveshape of output pulses emerging from the fiber link 120 can be less than ideal. Transmission induced distortions may include alteration of the pulse waveshapes away from that of the idealized, well-spaced and rectangular pulses and towards overlapping and non-rectangular pulses of varying magnitudes. The amount and kind of distortion may vary from one optical bandwidth to the next in the case where wavelength multiplexing is being used. The distorted optical output signal 127 of a given optical channel in the example shown at 100 is coupled by a second optical coupling 125 into an optical-to-electrical (O/E) transducer 130. (Optical coupling 125 may include an optical filter which extracts signal 127 from among numerous optical signals operating in different optical bandwidths.) The electrical output port 135 of the O/E transducer 130 carries a voltage output signal 137 having substantially the same waveshape as that of the received optical signal 127. A flat reference voltage line 138 is drawn in FIG. 1 on the voltage versus time graph that depicts signal 137 to indicate that output signal 137 can vary in magnitude versus time as well as in terms of pulse waveshape and inter-pulse overlap.

Output port 135 is coupled to a real-time adaptive distortion-remover or reducer 150 that is structured in accordance with the present disclosure. In one embodiment, port 135 is a high frequency differential voltage, output port. With proper operation of the adaptive distortion-reducer 150, the electrical output signal 157 of the adaptive distortion-reducer can be made to closely resemble the original signal 117 at the input end of the link 120. More specifics on how this happens will be provided shortly. The output port 158 of the distortion-reducer 150 may couple the reconstructed signal 157 to a digital receiver 160 for further processing therein and/or to an electrical-to-optical (E/O) transducer and repeater 170 which then transmits the reconstructed optical signal into yet a next-successive optical link like 120 (not shown). Another adaptive distortion remover like 150 may be provided at the end of that next-successive optical link. If the adaptive distortion removers (e.g., 150) were not present or other distortion compensating means were not provided, the maximum allowed continuous lengths of the fiber links would be specified as being about 3 to 4 times shorter, say 100 meters to 1 kilometer depending on transmission speed, optical carrier frequency, optical transmission modes, etc. The adaptive, real-time distortion removers (e.g., 150) make it possible to use longer continuous lengths of link media (e.g., fiber, or alternatively high frequency electrical cable) without concern for what signaling protocols (e.g., 8b/10b) are being used by the transmitted signals.

A more detailed structure of one embodiment of an adaptive distortion-remover in accordance with the invention is shown at 150'. The embodiment 150' may be implemented as a monolithic integrated circuit (IC) using mixed signal (analog and digital) CMOS technology with 0.13 micron field effect transistors. Other technologies may of course be used as appropriate for different applications. A differential voltage connection 135' carries the received voltage signal 137 to an automatic gain control (AGC) unit 151. The AGC unit 151 includes initial wave shaping functionality for partially reshaping the received pulses at the same time that the magnitudes of the received pulses are normalized to provide a constant magnitude envelope. The signal output at intermediate port 152 is shown to have pulses with substantially constant magnitude but still less then essentially rectangular pulse shapes. Final wave shaping takes place in unit 153. Unit 153 produces at its output port 158', the more rectangular wave pulse series shown at 157. Each of the automatic gain control (AGC) unit 151 and the final wave shaping unit 153 is under control of an adaptive controller 155. Feedback signals and control signals are carried on bidirectional lines 154 and 156 between the adaptive controller 155 and the respective initial and final wave-shaping units 151 and 153. The adaptive controller 155 may use spectral analysis techniques for determining how close to the ideal rectangular pulse shape the output signal pulses of output port 158' are. Spectral analysis may be further used continuously along the waveshape modifying path (inside units 151 and 153) to determine how well the reshaping is progressing in these cascaded units and to adaptively alter the reshaping process in order to achieve the desired results (the constant magnitude and substantially rectangular pulses shown at 157). In one embodiment, the adaptive controller 155 uses mostly digital circuitry for carrying out its functions while the waveshape modifying units (151 and 153) use mostly analog circuitry, particularly along the paths that conduct the high frequency and being-reshaped pulse signals (e.g., those at port 152). The adaptive controller 155 may include field reprogrammable memory and a microcontroller. The reprogrammable memory (not explicitly shown) may be reprogrammed in the field to thereby change the signal analysis and/or signal reshaping process carried out within the adaptive distortion remover 150'. A communications channel 159 that is separate from the channel of the high frequency communications pulses 117–157 may be used to carry reprogramming instructions, diagnostic signals and other such support signals between the adaptive controller and an external supervisory unit (not shown).

Figure 2:
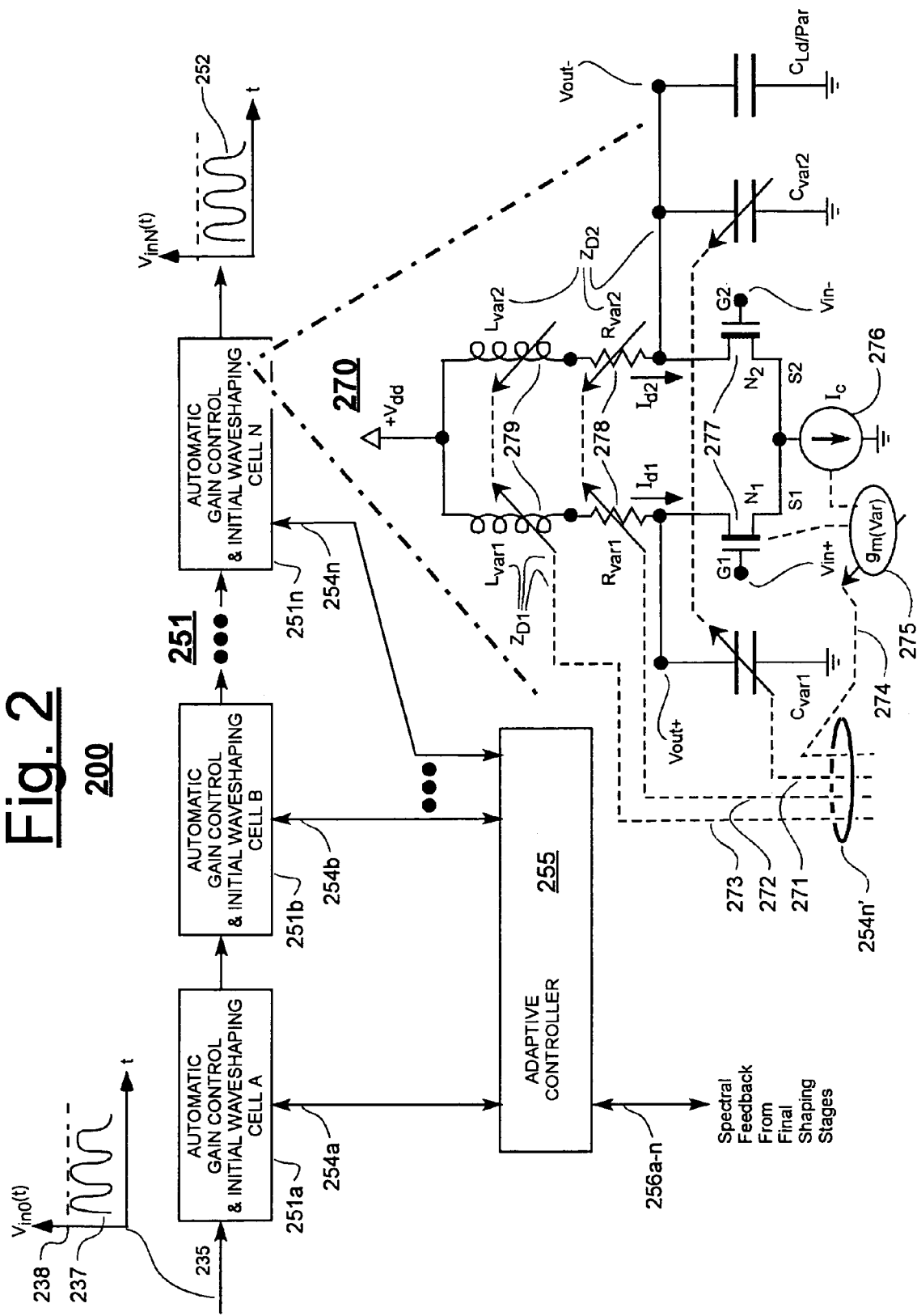
FIG. 2 is a schematic diagram showing further details of a combined automatic gain control and wave-shaping module that may be used in the adaptive distortion remover of FIG. 1.

Referring to FIG. 2, a more detailed schematic is provided of one IC embodiment 200. The IC 200 includes a mostly analog, automatic gain control (AGC) unit 251 and a mostly-digital, adaptive controller 255. As seen, the combined AGC and initial waveshaping unit 251 is itself comprised of a plurality of AGC/initial-waveshaping cells denoted as Cell-A, Cell-B . . . , Cell-N. In one embodiment, N equals 5. Larger or smaller numbers of the AGC/initial-waveshaping cells may be used as appropriate for different applications. The AGC/initial-waveshaping cells 251a, 251b, . . . , 251n are connected in series to provide a cascaded and progressive definition of the automatic gain control function and of the initial wave-shaping function.

The adaptive controller 255 has respective feedback and control links 254a, 254b, . . . 254n coupled to the respective AGC and initial wave-shaping cells 251a, 251b, . . . 251n. Additional feedback and control links 256a–n may be provided between the adaptive controller 255 and the final wave-shaping unit (not shown, see 153 of FIG. 1). A variety of techniques may be employed within the adaptive controller 255 for determining how it will command the AGC/initial-waveshaping cells 251a, 251b, . . . , 251n to behave, for determining when it will issue such commands, and for determining what stimuli it will respond to. The internal design of the adaptive controller 255 is outside the scope of the present disclosure. In one embodiment, the adaptive controller 255 responds to spectral analysis data obtained from the initial and final waveshaping units, where the spectral analysis data indicates how close to the ideal rectangular form are the waveshapes of the output pulses.

In the illustrated embodiment 200, each of the combined AGC-and-initial waveshaping cells 251a–251n includes a programmably adjustable, differential amplifier such as the one shown at 270. Control signals 271–274 are supplied from the adaptive controller 255 via communications channel 254n' to the amplifier 270 and these control signals specify both a base gain of the differential amplifier at the DC frequency (0 Hz) and also the spectral response of the amplifier 270 over its operational frequency range (e.g., 0 Hz–100 GHz).

The illustrated amplifier 270 includes symmetrically-opposed N-channel MOSFET transistors such as N1 and N2 (commonly denoted as 277) and a common, generally-constant current source 276 for causing the respective drain currents, $I_{d1}$, $I_{d2}$ of the transistors to counter one another symmetrically according to the equation: $I_{d1}+I_{d2}=I_c$. (Although source 276 is represented as a constant current source, the magnitude of $I_c$ is nonetheless programmably tunable so that different values of transconductance, $g_{mvar}$, can be realized.) Each of the symmetrically arranged transistors, N1 and N2 has a correspondingly symmetric drain impedance, $Z_{D1}$ or $Z_{D2}$, respectively presented at its drain node, where each drain impedance includes a non-negligible resistive component ($R_{var}$), a non-negligible inductive component ($L_{var}$) and a non-negligible capacitive component ($C_{var}$). It is to be understood that the non-negligible values of R, L and C will vary with application. Generally, L will be in the range of about 100 pH (pico Henries) to about 10 nH (nano Henries) for high frequency applications. Larger values may be used for lower frequency applications. The R value will depend on the power rail voltage (+Vdd) and on the DC current that is to flow when the input voltages are equal, $V_{in+}=V_{in-}$. In one embodiment, +Vdd is about 1.4 Volts.

Although DC analysis shows the capacitive component ($C_{var}$) to be in series connection between ground and the $+V_{dd}$ power rail together with the resistive component ($R_{var}$) and the capacitive component ($C_{var}$), those skilled in the art will appreciate that high frequency analysis considers the signal ground node as being shorted to the $+V_{dd}$ node, thereby causing $C_{var}$ to behave as a shunt capacitance coupled in parallel to the series combination of $R_{var}$ and $L_{var}$. The invention is not limited to such a simple organization of shunt capacitance and series RL. More complex combinations of shunt and/or series capacitances, inductances and resistances of one or both of the programmably-variable and fixed kinds may be employed to define the respective and symmetrically identical drain impedances, $Z_{D1}$ and $Z_{D2}$, of respective transistors N1 and N2. As those skilled in the art will appreciate, differential input voltages $V_{in+}$ and $V_{in-}$ are applied respectively to the gate terminals, G1 and G2 of the transistors 277. As $V_{in+}$ increases relative to $V_{in-}$, the respective N1 drain current, $I_{d1}$, will increase by a gain-determined amount while the respective N2 drain current, $I_{d2}$, will decrease by the same amount. If $V_{in+}$ decreases relative to $V_{in-}$, the opposite occurs. $I_{d1}$ decreases while $I_{d2}$ increases. The magnitude of $I_c$ is constant over the short run but can nonetheless be programmably tuned over the long run to implement variable gain for the differential amplifier 270.

Although not fully shown in FIG. 2, it is understood that each of the drain nodes of transistors N1 and N2 generally has a respective load capacitance ($C_{Ld}$) connected to it and it also has parasitic capacitances ($C_{Par}$) coupling the drain node to ground and/or to the chip bulk substrate in addition to having the adaptively controllable variable capacitance $C_{var1,2}$ coupling that drain node to ground or an AC-equivalent node. The drain load capacitances ($C_{Ld}$) are understood to be associated with the next differential amplifier stage in the cascaded series of AGC/initial-waveshaping cells 251a, 251b, . . . , 251n.

Using Laplace transform analysis, the voltage transfer function of the differential amplifier 270 maybe expressed as in the following equation Eq. 1:

$$\left| \frac{Vout(s)}{Vin(s)} \right| = g_m R \left[ \frac{1 + s(L/R)}{1 + s(RC) + s^2(LC)} \right] \quad \text{Eq. 1}$$

where $g_m$ is a variable or fixed transconductance value, R is the resistance value of one of the symmetrical variable resistors $R_{var1}$ and $R_{var2}$, L is the inductance in one of the symmetrical drain circuits and C is the capacitance in one of the symmetrical drain circuits. In accordance with the invention, at least two of L, R and C are programmably tunable in real time so that the frequency domain behavior of the differential amplifier 270 can adaptively changed to cope with changing external factors. $g_m$ may also be programmably tunable. The total capacitance value C is understood to be equal to the sum of $C_{var1}+C_{Ld/Par}$. Methods for programmably tuning $g_m$, R, L and C will be detailed below. Of importance, a figure of merit, m, for the frequency response of the illustrated, differential amplifier 270 may be defined per the following equation Eq. 2:

$$m = \frac{(RC)}{(L/R)} = \frac{R^2 C}{L} \quad \text{Eq. 2}$$

Note that m is a function of the square of R.

Figure 3:
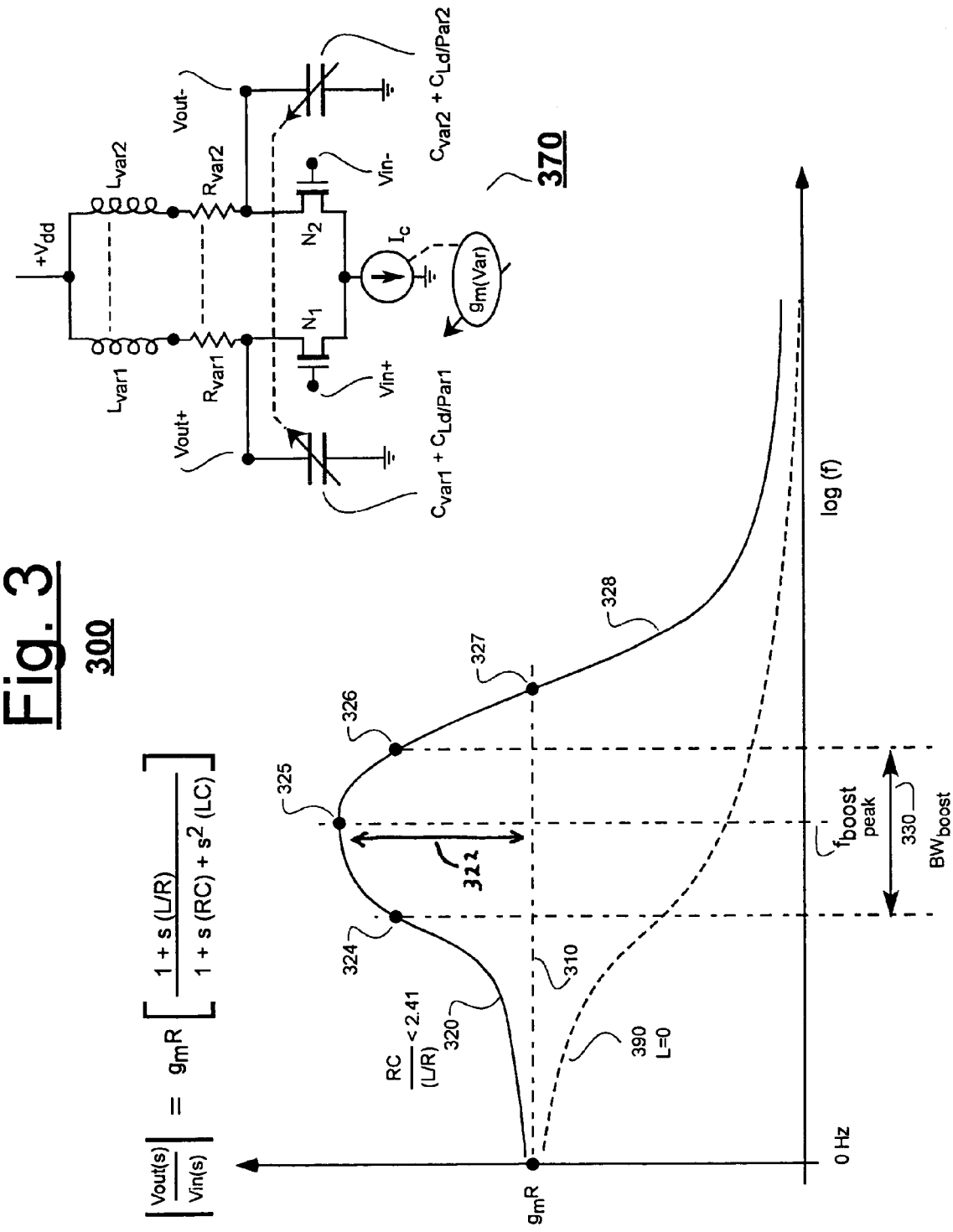
FIG. 3 includes gain versus frequency graphs for explaining the operation of one embodiment of the variable-$g_m$ and variable-RLC differential amplifiers disclosed herein.

Referring to FIG. 3, a characteristic, "boosted' frequency response 320 of amplifier 370 is shown by the solid curve at 320. For purposes of comparison, a "non-boosted" response curve is shown by dashed line 390. Dashed curve 390 represents the case where the drain load $Z_D$ has zero inductance (L=0) but a non-negligible shunt capacitance (C>0). In both the boosted and non-boosted cases, when input frequency is 0 Hz, then the gain of the differential amplifier 370 is simply $g_m \cdot R$. As frequency increases, output current is shunted to AC ground via the shunt capacitances of the drain impedances ($Z_{D1}$ and $Z_{D2}$). For the case of the non-boosted amplifier (dashed curve 390, where L=0), the effective magnitude of the real gain, |Vout(t)/Vin(t)| rolls down below the base gain $g_m \cdot R$ (below level 310) as frequency increases. This is so because the impedance of the shunt capacitance decreases as frequency increases. For the case of the boosted amplifier (curve 320, L>0), the inductances in the drain impedances $Z_D$ can contribute additional boost current to the output current to thereby counter, and even supercede, the current losses caused by the shunt capacitances. As a result, the magnitude of the real gain, |Vout(t)/Vin(t)| may first begin to increase above the base gain level 310 ($g_m \cdot R$) as frequency increases until the real gain reaches a peak 325 at a corresponding peak boost frequency, $f_{boost-peak}$, before beginning to roll off at higher frequencies toward the attenuated response region 328 after it crosses below the base gain level 310 (after crossover point 327). By varying two or all of R, L and C, it is possible to adjust the amount of boost 322 above the base gain level 310, it is possible to adjust the peak boost frequency ($f_{boost-peak}$), it is possible to adjust the effective bandwidth 330 of the boost (where points 324 and 326 are 6 db below peak point 325, and it is possible to adjust the crossunder frequency of point 327, the latter being the high frequency where the magnitude of the gain rolls off below the base gain level 310.

Referring briefly back to FIG. 2, it is to be understood that different values for the base gain ($g_m \cdot R$), peak boost frequency ($f_{boost-peak}$), amount of boost (322) and boost bandwidth (330) maybe used in respective ones of the cascaded series of cells 251a, 251b, . . . 251n to achieve desired waveform shaping and/or AGC by sequentially boosting different frequency bands differently along the cascaded series.

Referring again to FIG. 3, it maybe shown from Bessel function analysis that substantial inductive boosting begins to occur when the figure of merit, m of above Eq. 2 is about or less then 2.41. It may be seen that the boosting figure of merit, m, changes as a function of the square of R. Accordingly, significant changes in the amount of boosting provided at a given $f_{boost-peak}$ may be obtained with small changes in the value of R. The values of $f_{boost-peak}$ and the boost bandwidth 330 are functions of the locations of the poles and zeroes in the solution for the Laplace transfer function of Eq. 1 (above). Because adjustments made to R affect the value of the base gain 310 as well as affecting the amount of boost at $f_{boost-peak}$, it is desirable to be able to independently tune the base gain 310 and the boosting figure of merit, m. Accordingly, at least one of the L value and C value in amplifier 370 should be programmably tunable in addition to R being programmably and independently tunable. This is done so that a wide range of different values for the base gain ($g_m \cdot R$) and for m are made programmably available. In one embodiment, the drain inductance L is fixed while the drain capacitance and drain resistance are each independently tunable. In another embodiment, the drain inductance (L) and the drain resistance (R) are tunable while the drain capacitance (C) remains fixed. In yet another embodiment, all three of R, L, and C are independently tunable. The transconductance, $g_m$ is also independently tunable for each of these embodiments. Thus, the base gain ($g_m \cdot R$) can be programmably established by tuning $g_m$ alone, by tuning R alone, or by simultaneously tuning $g_m$ and R depending on whether or how much of a change to the boost figure of merit (m=(RC)/(L/R)) is desired and what base gain ($g_m \cdot R$) is simultaneously desired.

Figure 4:
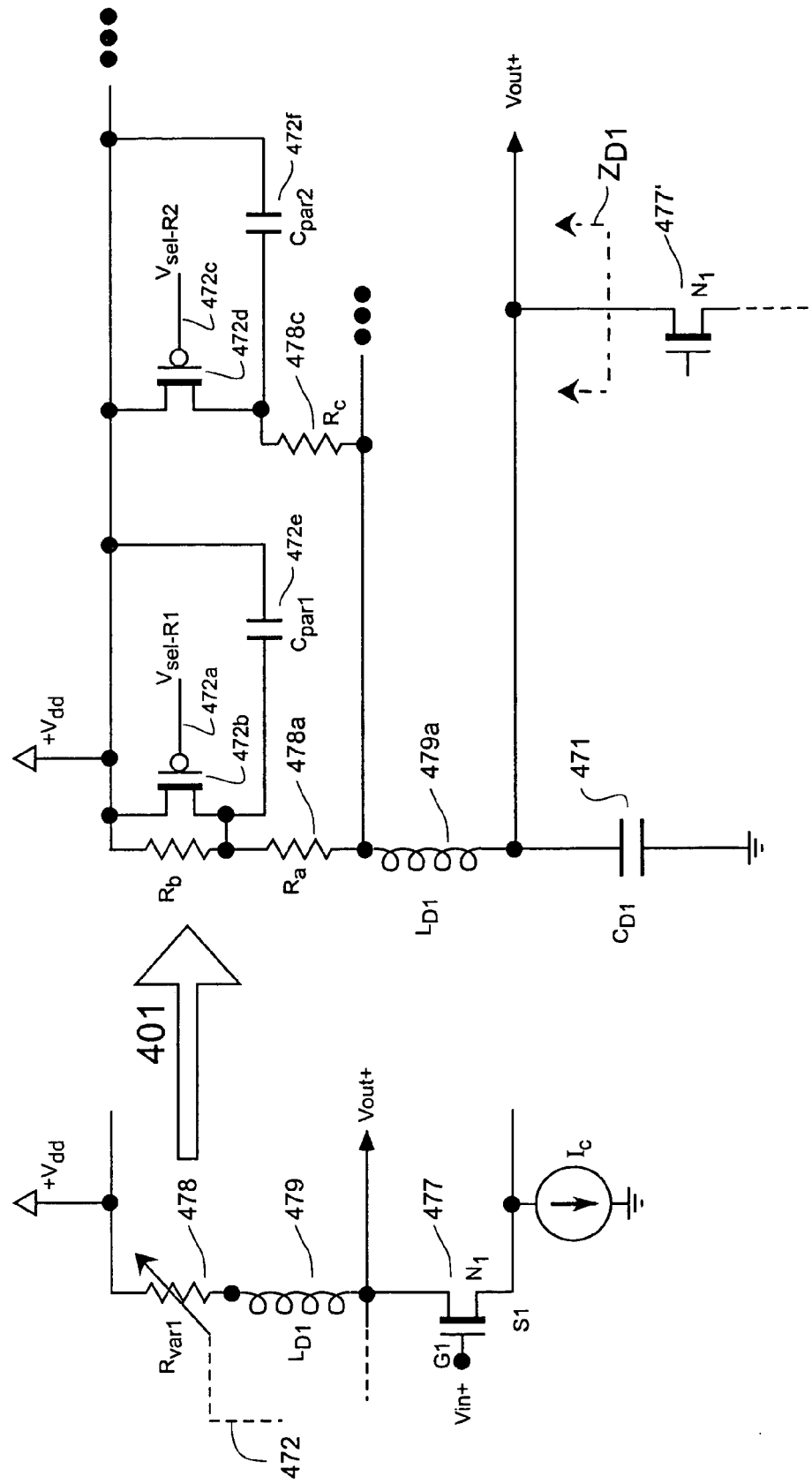
FIG. 4 is a schematic diagram showing methods for implementing discretely and/or continuously variable resistance ($R_{var}$) for the variable-RLC differential amplifiers of the invention.

A variety of methods may be used separately or in combination for realizing one or more of the variable drain capacitance ($C_{var}$), the variable drain inductance ($L_{var}$), the variable drain resistance ($R_{var}$) and the variable amplifier transconductance ($g_{mVar}$) FIG. 4 shows a few ways in which the drain resistance (R) may be tuned discreetly and/or continuously as maybe appropriate. The drain impedance ($Z_{D1}$) of only one of the differential amplifier transistors, 477 is shown. It is to be understood that the drain impedance of the other transistor will be substantially the same due to symmetry. Implementation arrow 401 shows that the variable drain resistance, $R_{var1}$ (478) is to be made responsive to resistance control signal 472 without substantially affecting the L or the C values of the drain impedance ($Z_{D1}$). Selection switches may be formed of digitally activated MOS pass transistors or by use of complementary transmission gates or by other such appropriate means. However, these various means often have parasitic capacitances ($C_{par1}$, $C_{par2}$) of their own. The parasitic capacitances may interfere with the desired m and C values of the drain impedance ($Z_{D1}$) if the switching elements are positioned improperly within the circuit. In one embodiment, the resistance changing elements (e.g., P-channel MOSFET's 472b and 472d) are positioned such that the effects of their respective parasitic capacitances ($C_{par1}$, $C_{par2}$) on the m factor are de-queued by the presence of fixed series and/or parallel resistances. More specifically, in the example of FIG. 4, the parasitic capacitance $C_{par1}$ between the drain node of P transistor 472b and AC ground is substantially de-queued by the presence of fixed parallel resistor $R_b$ and by the presence of fixed series resistor $R_a$. The de-queuing effect prevents $C_{par1}$ from substantially affecting the RC and LC factors of the resultant $Z_{D1}$ impedance. In one embodiment, fixed resistances are implemented with doped semiconductor regions such as doped polysilicon. The resistance selection signal, $V_{sel-R1}$ applied to the gate 472a of P-channel transistor 472b can be a discretely selected voltage (e.g., digital) or a continuously variable analog voltage for respectively providing discretely or continuously variable tuning of the L/R and RC factors that define the resultant $Z_{D1}$ impedance.

P transistor 472d represents an alternate way of providing variable resistance, by placing the resistance-varying element 472d in series with inductance 479a and in series with optional resistance 478c. Optional resistance 478c ($R_c$) helps to de-queue the effects of parasitic capacitance $C_{par2}$ on the RC and LC factors of the resultant $Z_{D1}$ impedance, particularly when P transistor 472d is in a nonconductive mode (acting as an essentially open switch). In certain applications, of course, it may be desirable to set $R_c$ to zero and to allow parasitic capacitance $C_{par2}$ to affect the RC and LC factors of the resultant $Z_{D1}$ impedance when transistor 472d becomes nonconductive. The resistance selection signal, $V_{sel-R2}$ applied to the gate 472c of P transistor 472d can be a discretely selected voltage (e.g., digital) or a continuously variable analog voltage for respectively providing discretely or continuously variable tuning of the L/R and RC factors that define the resultant $Z_{D1}$ impedance. It is to be understood that multiple copies of the parallel-resistance selecting circuit ($R_b$/472b) and/or the series-resistance selecting circuit ($R_c$/472d) may be used, or intertwined combinations (not shown) of these may be used, with each of the multiple copies having a respective set of values for resistances $R_a$, $R_b$ and/or $R_c$ as may be appropriate in a given application. More specifically, the values of $R_c$ may be increased per a mathematical succession (e.g., 1 KΩ, 2 KΩ, 4 KΩ, 8 KΩ, etc.) in the respective multiple copies so as to allow for digital selection of such specific values or of parallel combinations of such resistances.

FIG. 5A illustrates a first way 500 in which the drain inductance 579 may be modulated in response to a control signal 573. Implementation arrow 501 shows that selectable shorting switches (573b, 573g) may be formed of digitally activated MOS pass transistors provided in parallel with inductors 579a (inductance value $L_a$) and 579b (inductance value $L_b$) so as to selectively short-out the inductances and thereby provide three different values of effective inductance: $L_a$ alone or $L_b$ alone or $L_a$ plus $L_b$. However, in some implementations it is possible for the P transistors (573b, 573g) to be too small and for drain-to-source ON resistances ($R_{pDSon}$) of those P transistors to be sufficiently large relative to the impedances (real plus reactive parts) of their respective inductors (579b, 579a) such that the P transistors (573b, 573g) do not provide effective shorting-out of the inductances of their respective inductors. A counterbalancing trade-off exists between making the selectable shorting switches (573b, 573g) too large versus too small. If the shorting switches are made larger in size, their parasitic capacitances ($C_{par'1}$, $C_{par'2}$, $C_{par'3}$) will tend to become correspondingly larger and as such, may interfere with the desired m and C values of the drain impedance ($Z'_{D1}$). If the switches are made too small, they may fail to effectively short-out the impedances of the inductors, as already explained. The parallel, inductance shorting technique of FIG. 5A is useful in cases where the resistive portion of the impedance associated with the inductor is substantially larger than the resistance of the programmably actuatable shorting switch.

Figure 5B:
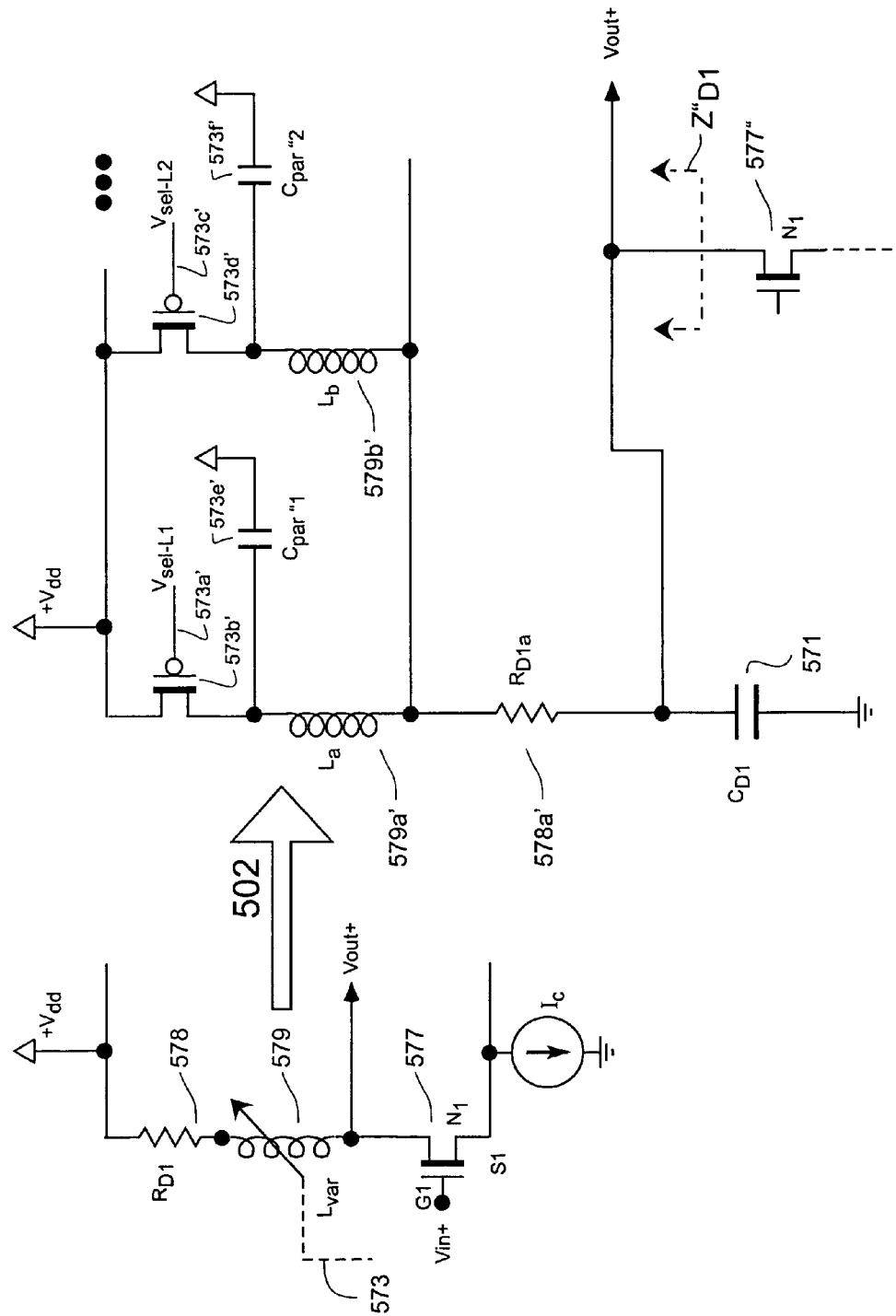
FIG. 5B is a schematic diagram showing a second method for implementing discretely variable inductance ($L_{var}$) for the variable-RLC differential amplifiers of the invention.

FIG. 5B illustrates a second way 500' in which the drain inductance 579 may be modulated in response to a control signal 573. Implementation arrow 502 shows that selectable circuit-opening switches (573b', 573d') may be formed of digitally activated MOS pass transistors provided in series with inductors 579a' (inductance value $L_a$) and 579b' (inductance value $L_b$) so as to provide three different values of effective inductance: $L_a$ alone or $L_b$ alone or $L_a$ in parallel with $L_b$. In this series mode of implementation the previous problem of excessive switch resistance is taken care. However, when either of switches 573b' and 573d' is in the nonconductive mode (open circuit), its corresponding parasitic capacitance ($C_{par''1}$, $C_{par''2}$) can nonetheless create an unwanted, series LC circuit within the overall $Z''_{d1}$ circuit, which can then create one or more undesirable notches in the frequency response of the circuit.

Figure 5C:
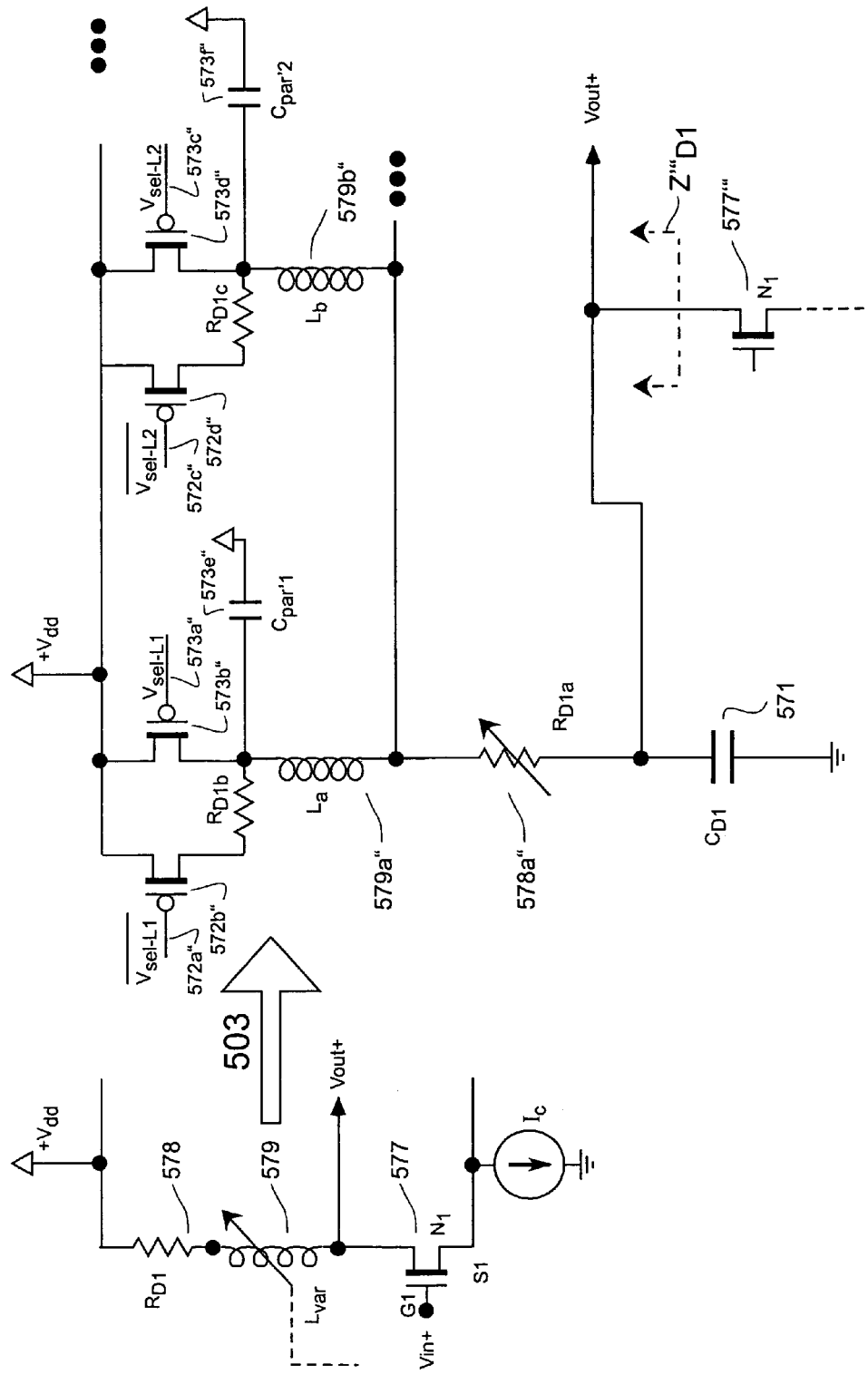
FIG. 5C is a schematic diagram showing a third method for implementing discretely variable inductance ($L_{var}$) for the variable-RLC differential amplifiers of the invention.

FIG. 5C illustrates a third way 500'' of selectably switching the inductances, where this third way takes care of both the previous problems (excessive switch resistance and interference from parasitic switch capacitance). In the third implementation 500'', drain inductance 579 is again modulated in response to the supplied control signal 573. Implementation arrow 503 shows that selectable circuit-opening switches (573b''', 573d'') may be formed of digitally activated MOS pass transistors provided in series with inductors 579a'' (inductance value $La$) and 579b'' (inductance value $L_b$) while also being in parallel with complementary switches 572b'' and 572d''. When gate signal $V_{sel-L1}$ goes high, its complement $V_{sel-L1-BAR}$ goes low and vise versa. Resistance $R_{D1b}$ may be integrally incorporated into transistor 572b'' as a relatively narrow and/or lightly doped channel. Alternatively, gate signal $V_{sel-L1}$ is not allowed to go fully high to the +$V_{dd}$ rail level, transistor 573b'' never becomes fully open as a result, and thereby provides the equivalent of de-queuing (De-Q'ing) resistance $R_{D1b}$. The De-Q'ing resistance, RD1b is set to reduce or prevent the undesirable response notch which may appear in the implementation of 5 B due to parasitic switch capacitance. Adjustment to $R_{D1a}$ may be desirable to counter the variable resistance effects of turning transistors 572b'' and 573d'' on and off.

Figure 5D:
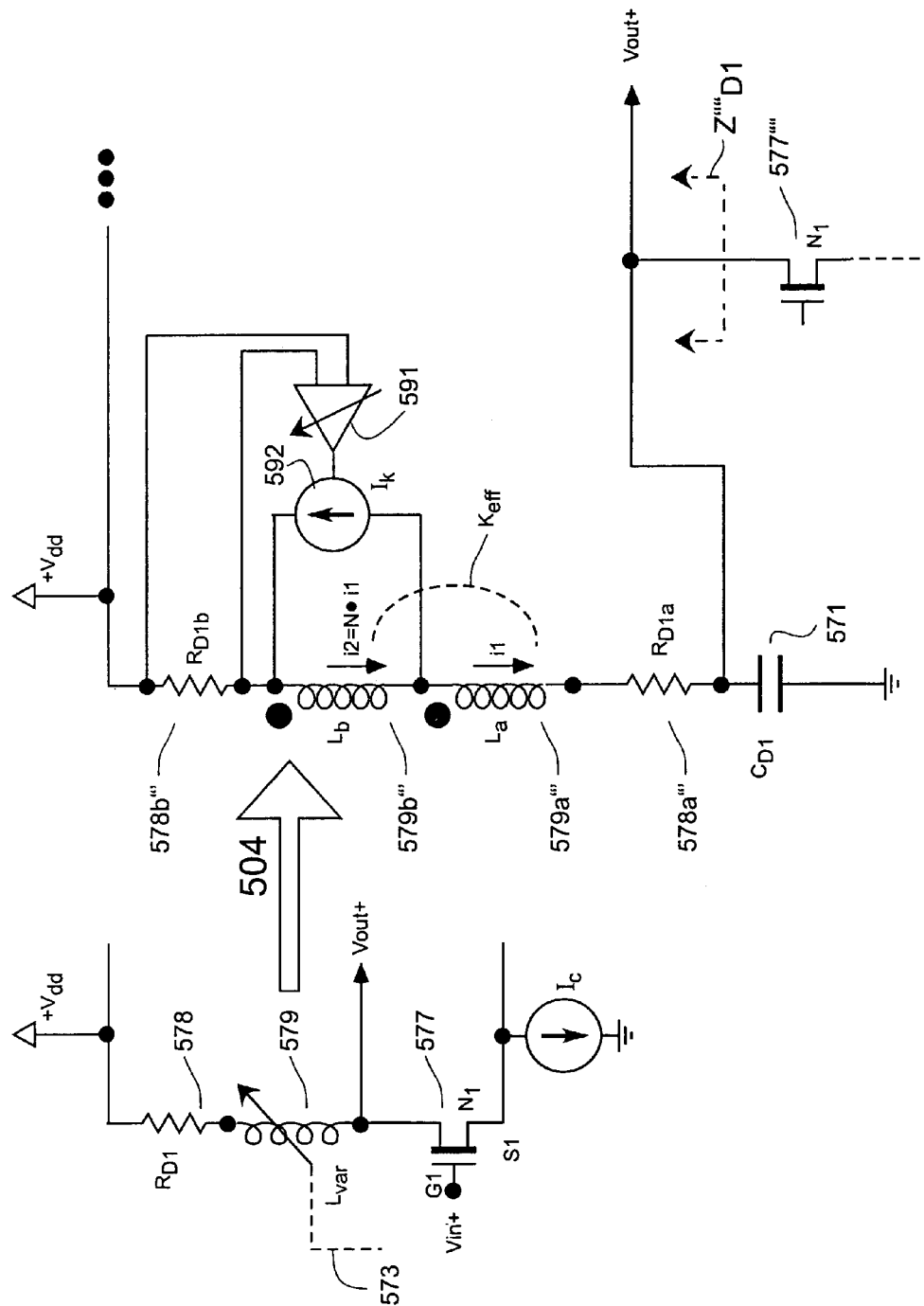
FIG. 5D is a schematic diagram showing a method for implementing continuously variable inductance ($L_{var}$) for the variable-RLC differential amplifiers of the invention.

FIG. 5D illustrates a fourth way 500''' in which the drain inductance 579 may be modulated in response to a control signal 573. Implementation arrow 504 shows that the inductance value, $L_{var}$ may be continuously tuned by use of a mutual inductance control circuit such as is disclosed in the above-cited U.S. Ser. No. 10/698,317 (entitled "Programmable Passive Inductor" and incorporated herein by reference). Briefly, the effective mutual inductance factor $K_{eff}$ between mutually coupled coils 579b''' and 579a''' may be changed by causing coil current i2 to be a controlled multiple, N of coil current i1 and by controlling the phase between i1 (flowing through $L_a$) and i2 (flowing through $L_b$). In the illustrated example, i1 is detected by resistance $R_{D1b}$. Variable gain amplifier 591 has a voltage sensitive input and a current output signal, $I_k$ as is indicated by current source 592. $I_k$ is forced equal to (N+1) times i1, thereby causing i2 to be equal to N times i1. The value of N is programmably adjustable. The effective combined inductance of the mutually coupled coils (e.g., stacked spirals in different metal layers of an IC) is a function of their independent inductances, $L_a$ and $L_b$ as well as their effective mutual inductance. Thus a continuously variable inductance is provided.

Methods for providing variable capacitances are well known and parasitic capacitance is not a problem since the variable capacitances $C_{var1}$, $C_{var2}$ shunt to AC ground. Discrete switches may be used in combination metal-insulator-metal (MIM) capacitors and/or voltage sensitive or insensitive MOS capacitors may be used. As was the case with the inductance setting switches, it is worthy to note that the capacitance-setting switches should be appropriately sized so as to reduce their series resistance but that increasing transistor size also tends to increase and the parasitic capacitance. Thus reduction of switch resistance and switch capacitance trade off with each other.

Methods for providing variable transconductance ($g_{mVar}$) are disclosed for example in the above-cited U.S. Ser. No. 10/724,449 (Digitally Controlled Transconductance Cell, which disclosure is incorporated herein by reference). Briefly, the number of transistors (e.g., different sized transistors) participating in each of the symmetrical branches of the differential amplifier (270) is programmably changed and/or the magnitude of the common constant current (276) is programmably changed. This has the effect of changing the amplifier's transconductance, $g_{mVar}$.

In conclusion it is seen that an energy efficient and resource efficient solution is provided for implementing AGC/wave-shaping cells such as 215a–251n of FIG. 2. The same cells may be simultaneously used both for generating a constant magnitude, signal envelope and for reshaping the pulse waveform in the time domain through selective filtering in the frequency domain. Inductive drain boosting is more energy efficient than alternative frequency compensating techniques such as degenerative source coupling, where in the latter, the gain of the differential amplifier is intentionally worsened at 0 Hz so that it can recover to its full potential as frequency increases.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A differential amplifier comprising:
   (a) first and second transistors having respective first and second drain nodes through which sum-constant currents respectively flow; and
   (b) first and second variable drain impedances respectively coupled to the first and second drain nodes, each of the variable drain impedances having an inductance (L), a capacitance (C) and a resistance (R), wherein at least said resistance (R) of each of the first and second variable drain impedances is adjustable and wherein at least one of said L and C of each of the first and second variable drain impedances is independently adjustable so that an output voltage versus the input voltage transfer function of the differential amplifier can exhibit a peak gain at a corresponding peak boost frequency which is greater than a base gain of the differential amplifier at 0 Hz and so that the peak gain and base gain can be adjusted independently of one another.

2. The differential amplifier of claim 1 wherein:
   the frequency response of the differential amplifier is a function of a figure of merit, m=(RC)/(L/R).

3. The differential amplifier of claim 1 and further comprising:
   (c) variable transconductance means which is operatively coupled to said first and second transistors and is adjustable independently of the adjustable ones of said R, L and C; said variable transconductance means providing the differential amplifier with a variable transconductance factor ($g_m$).

4. The differential amplifier of claim 1 wherein:
   (a.1) each of said first and second transistors is an N-channel insulated gate field effect transistor forming part of a monolithic integrated circuit.

5. The differential amplifier of claim 1 wherein:
   (b.1) adjustable ones of said inductance (L), capacitance (C) and resistance (R) are digitally adjustable.

6. The differential amplifier of claim 1 wherein:
   (b.1) said adjustable resistances (R) each includes:
   (b.1a) first and second resistances coupled in series with one another and provided between a corresponding drain of a corresponding one of the first and second transistors and AC ground; and
   (b.1b) a third transistor, coupled in parallel with the one of said first and second resistances that is closer to AC ground so that a capacitance of said third transistor is effectively de-queued by at least one of the first and second resistances from substantially altering the variable drain impedance of the corresponding one of the first and second transistors when the third transistor is not switched into a fully conductive mode.

7. The differential amplifier of claim 6 wherein:
(b.1b1) the third transistor is a digitally switched P-channel MOSFET.

8. The differential amplifier of claim 1 wherein:
(b.1) each adjustable resistance (R) includes:
(b.1a) a first resistance in series relation with a third transistor, the first resistance and third transistor being disposed between a corresponding drain of a corresponding one of the first and second transistors and AC ground such that the first resistance effectively de-queues a capacitance of the third transistor from substantially altering the variable drain impedance of the corresponding first or second transistor when the third transistor is not switched into a fully conductive mode.

9. The differential amplifier of claim 8 wherein:
(b.1b) the third transistor is a digitally switched P-channel MOSFET.

10. The differential amplifier of claim 8 wherein:
the adjustable resistances (R) each includes:
(b.1b) a second resistance in series relation with a fourth transistor, the second resistance and fourth transistor being disposed between the corresponding drain of the corresponding one of the first and second transistors and said AC ground node such that the second resistance effectively de-queues a capacitance of the fourth transistor from substantially altering the variable drain impedance of the corresponding first or second transistor when the fourth transistor is not switched into a fully conductive mode.

11. The differential amplifier of claim 1 wherein:
(b.1) adjustable ones of said inductance (L), and capacitance (C) include:
(b.1a) two or more inductances in series with one another and disposed between a corresponding drain of a corresponding one of the first and second transistors and AC ground; and
(b.1b) a third transistor coupled in parallel with the one of said two or more inductances.

12. The differential amplifier of claim 1 wherein:
(b.1) adjustable ones of said inductance (L), and capacitance (C) include:
(b.1a) two or more inductances each in series with a corresponding first switching transistor, the respective series combinations of inductances and corresponding first switching transistors being disposed between a corresponding drain of a corresponding one of the first and second transistors and AC ground.

13. The differential amplifier of claim 12 wherein adjustable ones of said inductance (L), and capacitance (C) further include:
(b.1b) for each first switching transistor and in-series inductance, a combination of a second switching transistor and inherent or external de-queuing resistance coupled in parallel with the each first switching transistor and its in-series inductance, the second switching transistor being switched into conductive mode when its corresponding first switching transistor is switched into nonconductive mode and vise versa.

14. The differential amplifier of claim 1 wherein adjustable ones of said inductance (L), and capacitance (C) include:
(b.1) plural inductances in series and mutually inductive relation with one another, the plural inductances being disposed between a corresponding drain of a corresponding one of the first and second transistors and an AC ground node; and (b.2) a voltage dropping resistance in series with the plural inductances;
(b.3) a voltage controlled, variable current source coupled to one of the plural inductances and responsive to a variable multiple of a voltage developed across said voltage dropping resistance.

15. A differential amplifier comprising:
(a) first and second transistors having respective first and second drains through which first and second drain currents respectively flow; and
(b) first and second variable drain impedances respectively coupled to the first and second drains, each of the variable drain impedances having an inductance (L), a capacitance (C) and a resistance (R), wherein at least one of said R, L and C is adjustable so that an output voltage versus input voltage transfer function of the differential amplifier can exhibit a peak gain at a corresponding peak boost frequency which is greater than a base gain of the differential amplifier at 0 Hz; wherein:
(b.1) at least said inductance (L) of each of the first and second variable drain impedances is adjustable and the differential amplifier includes inductance-selecting switches having capacitances that are resistively separated from the capacitances (C) of the first and second variable drain impedances.

16. A differential amplifier that exhibits an output voltage versus input voltage transfer function having a peak gain at a corresponding peak boost frequency which is greater than a base gain of the differential amplifier at 0 Hz, said differential amplifier comprising:
(a) first and second opposed active devices; and
(b) respective first and second reactive loads, operatively coupled respectively to the first and second active devices, each of the first and second reactive loads including a variable resistance and at least one of a variable inductance and a variable capacitance, said variable resistance being adjustable independently of the at least one variable inductance and variable capacitance so that the base gain of the amplifier can be adjusted independently of said peak gain.

17. The differential amplifier of claim 16 and further comprising:
(c) transconductance adjusting means operatively coupled to the first and second active devices, the transconductance adjusting means being for adjusting corresponding transconductance characteristics of the devices.

18. The differential amplifier of claim 16 wherein said first and second reactive loads each includes at least the adjustable inductance.

19. A reconfigurable differential amplifier comprising:
(a) a first transistor having a first drain through which a respective first drain current flows;
(b) a second transistor having a second drain through which a respective second drain current flows,
where the first and second transistors are matched and a sum of the first and second drain currents remains substantially constant during a given configuration of the reconfigurable differential amplifier;
(c) a first variable drain impedance coupled to the first drain, the first variable drain impedance having a respective first inductance (L1), first capacitance (C1) and first resistance (R1), wherein at least one of said R1, L1 and C1 is variable;
(d) a second variable drain impedance coupled to the second drain, the second variable drain impedance having a respective second inductance (L2), second capacitance (C2) and second resistance (R2), wherein at least one of said R2, L2 and C2 is variable and the second variable drain impedance is matched to the first variable drain impedance;

wherein said first and second variable drain impedances are configurable so that an output voltage versus input voltage transfer function of the differential amplifier can exhibit a peak gain at a corresponding peak boost frequency and where the peak gain is greater than a base gain of the differential amplifier at 0 Hz; and (e) base gain adjusting means responsive to a variable control signal supplied from an adaptive controller for varying said base gain, where the control signal changes in adaptive response to changing stimuli supplied to the adaptive controller.

20. The reconfigurable differential amplifier of claim 19 wherein:
(b.1) at least the respective inductance (L1 or L2) of each of the first and second variable drain impedances is adjustable and the differential amplifier includes inductance-selecting switches having capacitances that are resistively separated from the respective first and second capacitances (C1 and C2) of the first and second variable drain impedances.

21. The reconfigurable differential amplifier of claim 19 wherein:
(b.1) at least the respective inductance (L1 or L2) of each of the first and second variable drain impedances is adjustable and the differential amplifier includes inductance-selecting switches having capacitances where the inductance-selecting switches are switched into respective conductive states that pass corresponding portions of the drain current through respective inductors of the inductance-selecting switches, and
(b.2) the respective capacitances of corresponding inductance-selecting switches are discharged by selectively activated resistances when the corresponding inductance-selecting switches are switched into nonconductive modes.

22. The reconfigurable differential amplifier of claim 19 wherein:
(b.1) at least the respective inductance (L1 or L2) of each of the first and second variable drain impedances is adjustable and the differential amplifier includes inductance-selecting switches having capacitances where in one switching mode, selected ones of the inductance-selecting switches are each switched into respective and relatively highly conductive state that passes a corresponding portion of the first or second drain current through a respective inductor of the highly conductive inductance-selecting switch, and
(b.2) where in a second switching mode, selected ones of the inductance-selecting switches are each switched into a respective and comparatively less conductive state that provides a capacitance discharging resistance that operates to de-queue the capacitance of the respective inductance-selecting switch that is switched into said less conductive state.

23. The reconfigurable differential amplifier of claim 19 wherein:
(b.1) at least the respective resistance (R1 or R2) of each of the first and second variable drain impedances is adjustable and the differential amplifier includes resistance-selecting switches having capacitances that are resistively separated from the respective first and second inductances (L1 and L2) of the first and second variable drain impedances.

24. The reconfigurable differential amplifier of claim 19 wherein:
(b.1) at least two of said inductance, capacitance and resistance of each of the first and second variable drain impedances are independently adjustable.

25. A reconfigurable differential amplifier comprising:
(a) a first transistor having a first drain through which a respective first drain current flows;
(b) a second transistor having a second drain through which a respective second drain current flows,
where the first and second transistors are matched and a sum of the first and second drain currents remains substantially constant during a given configuration of the reconfigurable differential amplifier;
(c) a first variable drain impedance coupled to the first drain, the first variable drain impedance having a respective first inductance (L1), first capacitance (C1) and first resistance (R1), wherein at least one of said R1, L1 and C1 is variable;
(d) a second variable drain impedance coupled to the second drain, the second variable drain impedance having a respective second inductance (L2), second capacitance (C2) and second resistance (R2), wherein at least one of said R2, L2 and C2 is variable and the second variable drain impedance is matched to the first variable drain impedance;
wherein said first and second variable drain impedances are configurable so that an output voltage versus input voltage transfer function of the differential amplifier can exhibit a peak gain at a corresponding peak boost frequency and where the peak gain is greater than a base gain of the differential amplifier at 0 Hz;
wherein the base gain is adjustable; and wherein:
(b.1) at least the respective first and second resistances (R1, R2) of the first and second variable drain impedances are adjustable.

26. The reconfigurable differential amplifier of claim 25 wherein:
(b.2) the frequency response of the differential amplifier is a function of a figure of merit, $m=(RC)/(L/R)$, where R corresponds to R1 or R2, C corresponds to C1 or C2, and L corresponds to L1 or L2 and where m is maintained in a range of about 2.41 or less.

27. A reconfigurable differential amplifier comprising:
(a) a first transistor having a first drain through which a respective first drain current flows;
(b) a second transistor having a second drain through which a respective second drain current flows,
where the first and second transistors are matched and a sum of the first and second drain currents remains substantially constant during a given configuration of the reconfigurable differential amplifier;
(c) a first variable drain impedance coupled to the first drain, the first variable drain impedance having a respective first inductance (L1), first capacitance (C1) and first resistance (R1), wherein at least one of said R1, L1 and C1 is variable;
(d) a second variable drain impedance coupled to the second drain, the second variable drain impedance having a respective second inductance (L2), second capacitance (C2) and second resistance (R2), wherein at least one of said R2, L2 and C2 is variable and the second variable drain impedance is matched to the first variable drain impedance;
wherein said first and second variable drain impedances are configurable so that an output voltage versus input voltage transfer function of the differential amplifier can exhibit a peak gain at a corresponding peak boost frequency and where the peak gain is greater than a base gain of the differential amplifier at 0 Hz; and (e) variable transconductance means which is adjustable independently of adjustable ones of said R1 R2, L1 and L2, and C1 and C2, the variable transconductance means being for providing the differential amplifier with a variable transconductance factor ($g_m$).

28. A reconfigurable differential amplifier comprising:

(a) a first transistor having a first drain through which a respective first drain current flows;

(b) a second transistor having a second drain through which a respective second drain current flows, where the first and second transistors are matched and a sum of the first and second drain currents remains substantially constant during a given configuration of the reconfigurable differential amplifier;

(c) a first variable drain impedance coupled to the first drain, the first variable drain impedance having a respective first inductance (L1), first capacitance (C1) and first resistance (R1), wherein R1 is variable and at least one of L1 and C1 is variable independently of R1;

(d) a second variable drain impedance coupled to the second drain, the second variable drain impedance having a respective second inductance (L2), second capacitance (C2) and second resistance (R2), wherein R2 is variable and at least one of L2 and C2 is variable independently of R2.

* * * * *